United States Patent [19]
Trotter, Jr. et al.

[11] Patent Number: 4,776,868
[45] Date of Patent: Oct. 11, 1988

[54] LENSES AND LENS ARRAYS

[75] Inventors: Donald M. Trotter, Jr., Corning; Arthur J. Whitman, Horseheads, both of N.Y.

[73] Assignee: Corning Glass Works, Corning, N.Y.

[21] Appl. No.: 942,841

[22] Filed: Dec. 17, 1986

Related U.S. Application Data

[63] Continuation-in-part of Ser. No. 773,666, Sep. 9, 1985, abandoned.

[51] Int. Cl.$^4$ .................... C03B 19/00; B29D 11/00
[52] U.S. Cl. ............................. 65/18.2; 65/37; 264/1.2; 264/1.1; 350/417; 427/162
[58] Field of Search ............. 264/1.1, 1.2, 1.4, 81, 264/309, 299, 1.7, 1.9; 65/18.2, 18.3, 37, 99.1, 66, 122; 350/417, 435, 412, 320, 96.18; 427/162, 282

[56] References Cited

U.S. PATENT DOCUMENTS

| | | | |
|---|---|---|---|
| 3,351,449 | 11/1967 | Ambrogi | 65/122 |
| 3,369,274 | 2/1968 | Dicks | 264/309 |
| 3,371,138 | 2/1968 | Zablocki | 264/309 |
| 3,846,165 | 11/1974 | Ettenberg | 427/162 X |
| 4,100,313 | 7/1978 | Hammer | 427/162 |
| 4,183,617 | 1/1980 | Isaacs | 350/96.12 |
| 4,273,812 | 6/1981 | Tsutsui | 427/282 X |
| 4,278,710 | 7/1981 | Jelks | 427/282 X |

FOREIGN PATENT DOCUMENTS 59-190833 10/1984 Japan ..................... 264/1.1

*Primary Examiner*—Kenneth M. Schor
*Attorney, Agent, or Firm*—Clinton S. Janes, Jr.

[57] ABSTRACT

This invention relates to a method for preparing a lens or a lens array and apparatus for carrying out the method. The method comprises directing, in line of sight in a vacuum, the vapor of a substance, which is solid and transparent at ambient temperature, from a source of that vapor through a hole in a mask to form a deposit on a substrate. The mask is so positioned between the vapor source and the substrate that obscuration by the solid portions of the mask around the hole causes the deposit to assume a curved surface and function as a lens.

8 Claims, 10 Drawing Sheets

LENSES AND LENS ARRAYS

This application is a continuation-in-part application of Ser. No. 773,666, filed Sept. 9, 1985 and now abandoned.

BACKGROUND OF THE INVENTION

This invention relates to the preparation of lenses by solidification of a vapor-phase material in the shape of a lens as opposed to the conventional formation of lenses by such means as grinding and polishing or etching.

The prior art has disclosed numerous methods for preparing lenses including grinding and polishing, etching, and the solidification of a liquid, especially a molten glass or liquid plastic. Each method has significant shortcomings in producing lenses of close tolerances to a particular symmetry and surface figure. To illustrate:

Grinding and polishing operations are hampered by the fact that precise machine or manual control is required to insure that the desired precise curvature is obtained. Additionally, grinding and polishing operations are, in general, not suitable for producing very small lenses or lens arrays.

Etching methods, especially for lens arrays, are heavily dependent upon acid resists being applied to a substrate in a desired accurate pattern, upon differences or gradients in acid resistance of a substrate, upon carefully controlled compositions having particular etching rates, or upon a combination of those three factors.

The fabrication of small lenses ad lens arrays has relied primarily upon molding or upon the curvature developed as a result of surface tension during the solidification of a material from the liquid state, e.g., the cooling of molten glass. Precise control of curvature is very difficult when lenses and lens arrays are formed through surface tension because of inherent limitations in the method. Thus, the lens surface figures obtainable are restricted to those naturally occurring in droplets of the liquid material. Moreover, even if this surface figure is suitable, the lens curvature may vary as a result of variations in surface tension, density of the liquid material, and quantity of the liquid material. Finally, in the case of forming lens arrays, it is difficult to position and retain a liquid at the precise desired location in the exact desired quantity. This last problem is illustrated in U.S. Pat. No. 3,351,449.

That patent describes the deposition of a gob of molten glass of controlled volume onto a substrate. The curved surfaces of the gob upon solidification could be considered to represent a lens. Such methods, however, are limited to materials having a plastic state where they can be rendered workable by exposure to elevated temperatures or by admixture with a solvent. Those methods are very difficult to apply to such desirable optical materials as alumina because of the exceedingly high temperatures required and the extremely rapid rate of solidification exhibited by those materials. Furthermore, the surface figure secured is governed by surface tension forces, which will not necessarily yield the figure required for a particular application and which restrict the symmetry of the lenses to cylindrical, i.e., circular in plan view, which also may not be desired for certain applications.

Some of those problems can be reduced by utilizing molding. Japanese Patent Application 66,115, filed Apr. 14, 1983, discloses the preparation of concave spherical lenses by dropping molten alumina onto a spherical mold. That process, however, requires prior fabrication of the mold, a difficult operation demanding grinding and polishing procedures of the same extreme degree of precision as is necessary in the direct formation of lenses by grinding and polishing. Also, the dropping process inherently results in the upper surface figure of the lens being defined by surface tension forces. Moreover, even if the symmetry and surface figure of the lenses prepared by molding or as developed solely through surface tension forces are suitable, the highest quality lenses and lens arrays with the fewest imperfections and highest polish require further treatment. Finally, the extremely high temperatures required preclude the use of most mold materials except graphite.

Vacuum deposition processes, such as thermal evaporation or sputtering, have been employed to coat lenses or windows with optical materials. The basic mechanism of those processes involves transporting the optical material in the form of vapor along lines of sight in a vacuum from the source of the material to a substrate where it condenses essentially instantaneously to a solid. U.S. Pat. No. 3,846,165 is illustrative of such a process and describes the deposition of such materials as silicon monoxide, alumina, and tungsten oxide to form an anti-reflective coating. Exceedingly close thickness tolerances are demanded for the proper functioning of such coatings. A mask with substantial open area is typically placed in contact or nearly in contact with the surface of the object to be coated to confine the coating deposit to the proper location. The mask serves solely that function and none other. The required extreme degree of thickness uniformity is strictly dependent upon the proper functioning of the evaporative source of the material.

Masking has also been utilized in depositing small narrow patterns, commonly of metals, through vacuum deposition processes. U.S. Pat. No. 4,100,313 describes the use of a long narrow slit of substantial thickness combined with a second thin mask with a single limiting aperture between the thick mask and the source of the coating material. The combination of slit plus object to be coated is tilted relative to the line of sight along which the coating material is being transported from the source of coating material to the object to be coated. That action reduces the effective width of the slit. The apertured thin mask produces a beam of coating material which exhibits reduced angular divergence such that, after passing through the tilted thick mask, it continues along the path of line of sight until being deposited in a narrow line with well-defined boundaries.

U.S. Pat. No. 4,278,710 discloses the use of a similar aperture in a thin mask. Hence, a mask containing an enlarged version of the desired pattern for depositing a coating is placed near the source of the material to be evaporated and the thin mask with a single, small limiting aperture is placed between the pattern mask and the object to be coated. Material emitted from the evaporative source passes through the pattern mask and, after passing through the aperture in the thin mask, has reduced angular divergence as it continues on to the object to be coated, thereby forming a deposit having well-defined edges which is a reduced version of the pattern in the pattern mask.

U.S. Pat. No. 4,273,812 describes the use of a mask separated slightly from the object to be coated, along with two properly placed evaporative sources, to obtain overlap beneath the mask of material deposited through two mask openings.

Whereas the prior art discloses the use of vacuum deposition techniques to transport optical materials and pattern them in a two-dimensional manner, utilizing masks as described above, those processes are not operable for the three-dimensional shape control demanded for the formation of lenses and lens arrays. Most important, the use of apertures to restrict the angular divergence of the material being deposited, as taught in U.S. Pat. No. 4,278,710 and in U.S. Pat. No. 4,100,313, leads to a deposit having an overall shape which, in plan view, is determined by the mask, but which is of essentially uniform thickness with sharp edges and, hence, not operable for use as a lens. U.S. Pat. No. 4,273,812 utilizes a mask spaced from the substrate and does not mention the use of limiting apertures, but employs two evaporative sources of material and narrowly-separated mask openings which yield deposits overlapping one another to produce a continuous, fairly uniform deposit which, likewise, is also unsuitable for use as a lens. Furthermore, those prior art methods provided no means for removing the deposited material from the substrate after their formation.

Therefore, the primary objective of the instant invention was to develop a method for preparing lenses and lens arrays which avoids the above problems of formation.

SUMMARY OF THE INVENTION

We have found that objective can be achieved in an invention which, in broad terms, comprises a method for forming at least one lens by directing, in line of sight in a vacuum, a vapor phase of a substance through at least one hole in a mask onto a substrate where the vapor solidifies essentially instantaneously. The substance must be transparent and solid at the temperature the lens is intended for use. The source of vapor may be a reservoir of the substance maintained at elevated temperature such that the vapor evaporates or sublimes therefrom, or a body of the substance from which vapor is projected by sputtering. The mask is spaced apart from the substrate so that obscuration of portions of the vapor source by solid portions of the mask surrounding the hole therein causes the deposit of the substance upon the substrate to exhibit a convex surface. The substrate may comprise a flat body of material which is soluble in a solvent in which the lens substance is insoluble, thereby facilitating subsequent removal of the lens therefrom. Where a lens array is the product to be formed, an insoluble transparent substrate material may be employed, since the lenses will not be removed from the substrate. In addition, the substrate may comprise a flat body of soluble material upon which a convex lens deposit of soluble material has already been prepared by the inventive method. Thereafter, an insoluble lens deposit may be formed atop this soluble lens such that, upon subsequent solution of the substrate, a convex-concave lens is produced.

The instant invention also includes an apparatus for practicing the above-described method. The components of the apparatus consist of at least one source for the desired vapor phase and at least one mask located between that source and the substrate, which mask is provided with at least one hole such that vapor passing through the hole will strike and solidify as a deposit upon the substrate. The mask is spatially separated from the substrate and the vapor source such that obscuration by solid portions of the mask around the hole therein causes the deposit upon the substrate to assume a convex surface geometry.

The present invention further includes lenses and lens arrays prepared in accordance with the inventive method. The lens arrays consist of a series of lenses formed upon a substrate wherein the lenses have convex surface configurations and wherein both the lenses and at least those portions of the substrate beneath the lenses are transparent.

FI. 2 is a cross-sectional view of a vapor sourc,e, mask, and substrate showing the preferred relationship of angular extent of mask hole and vapor source for practicing this invention.

Figure 3A:
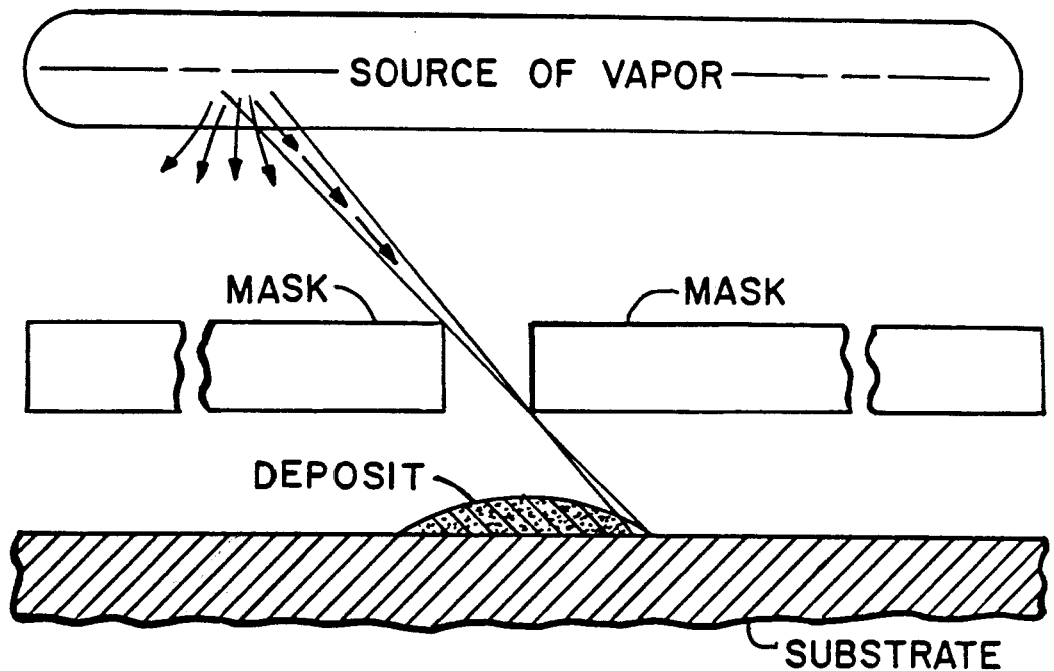
Figure 3B:
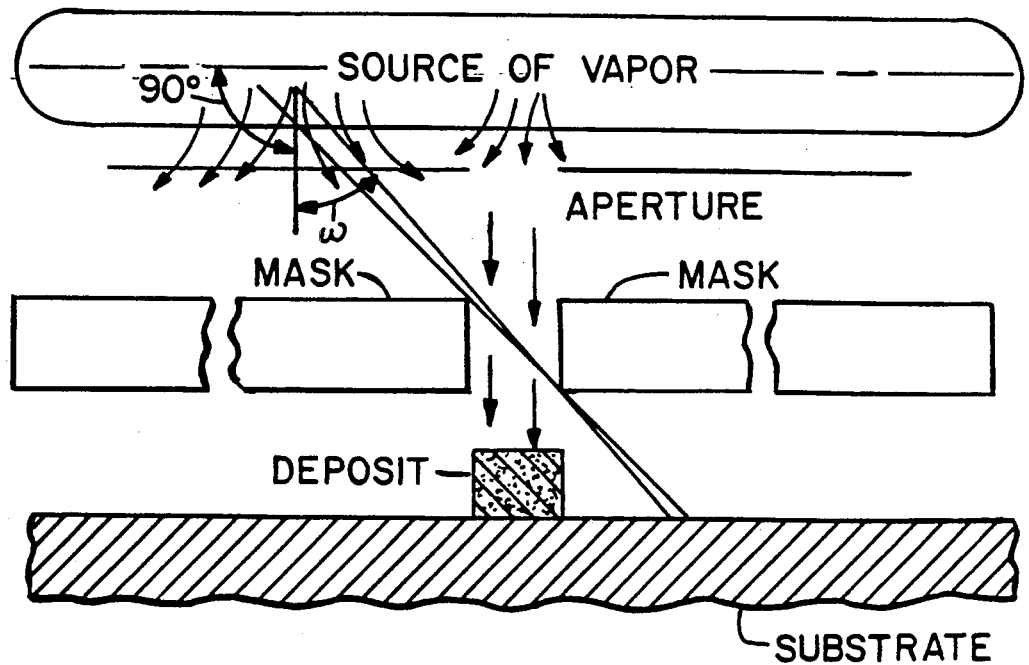

FIGS. 3a and 3b are each a cross-sectional view of a vapor source, mask and substrate, with (3b) and without (3a) limiting aperture, showing that this invention cannot be practiced with a limiting aperture.

Figure 4:
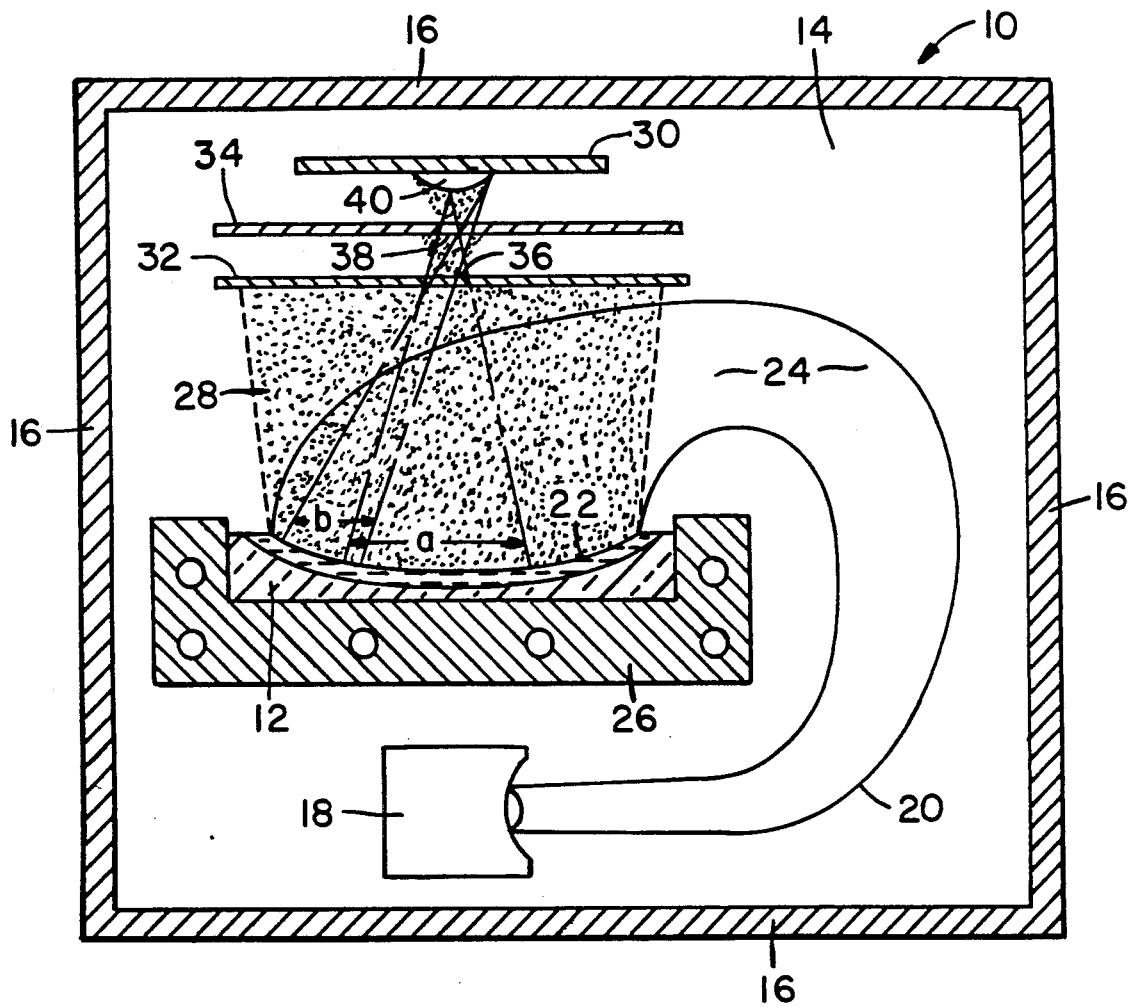

FIG. 4 is an elevational cross-sectional view of an electron beam system vapor source for use in accordance with the present invention.

Figure 5:
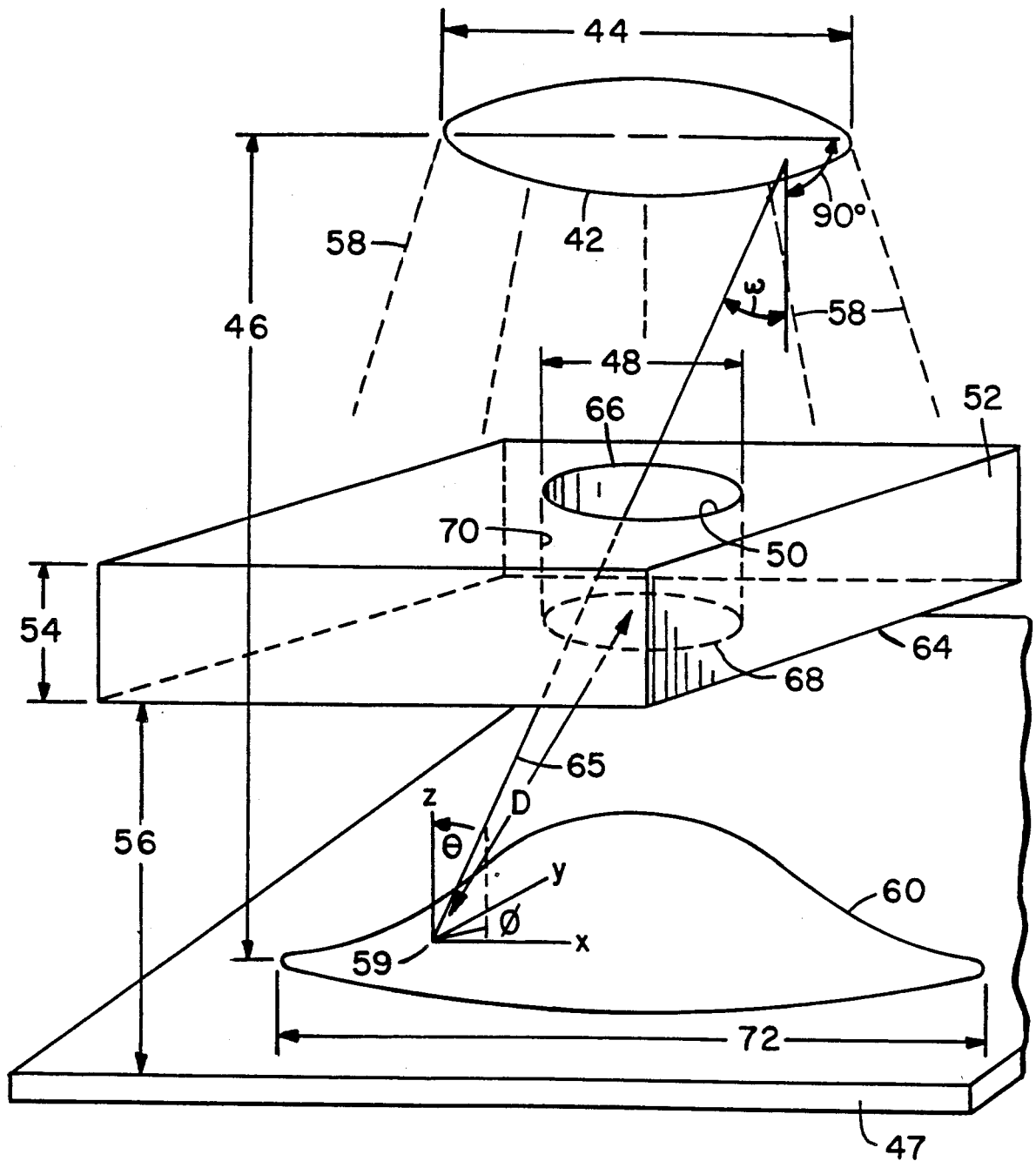

FIG. 5 is a perspective view of a vapor source, mask, and substrate with deposit.

Figure 6:
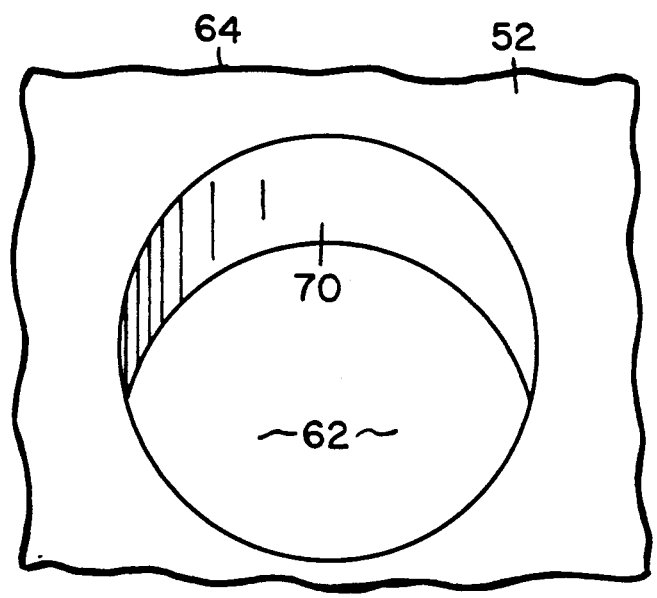

FIG. 6 is a bottom view of a vapor source viewed from the substrate through the mask.

Figure 7:
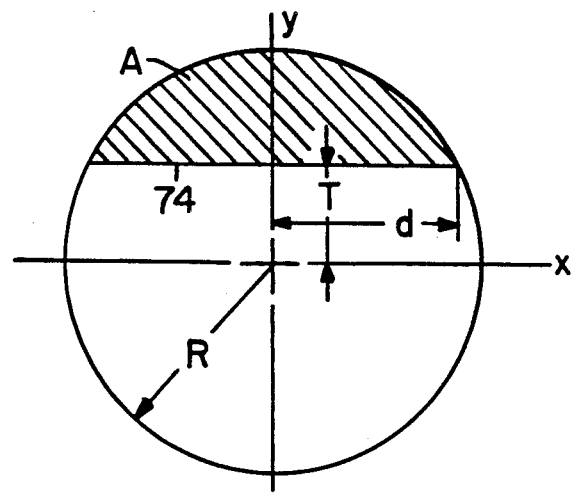

FIG. 7 is a circle showing an area defined by a chord and the arc subtended by the chord.

Figure 8:
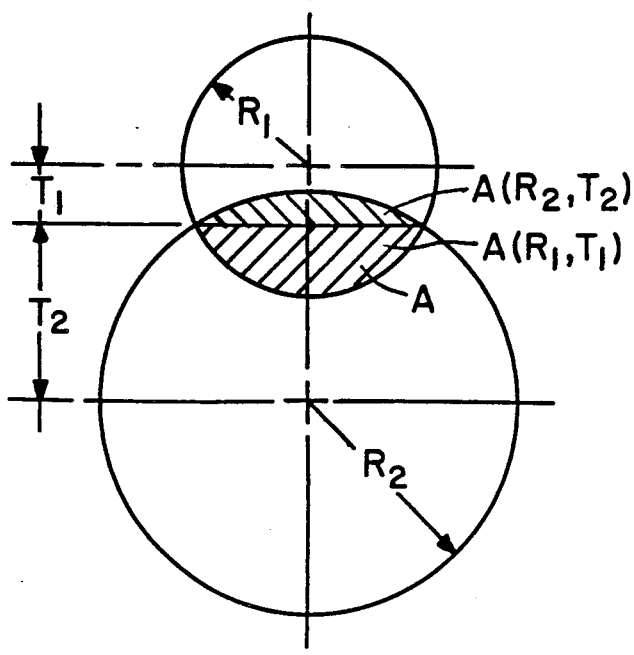

FIG. 8 shows two intersecting circles with areas defined by a chord drawn between their intersections and the arcs subtended by the chord.

Figure 9:
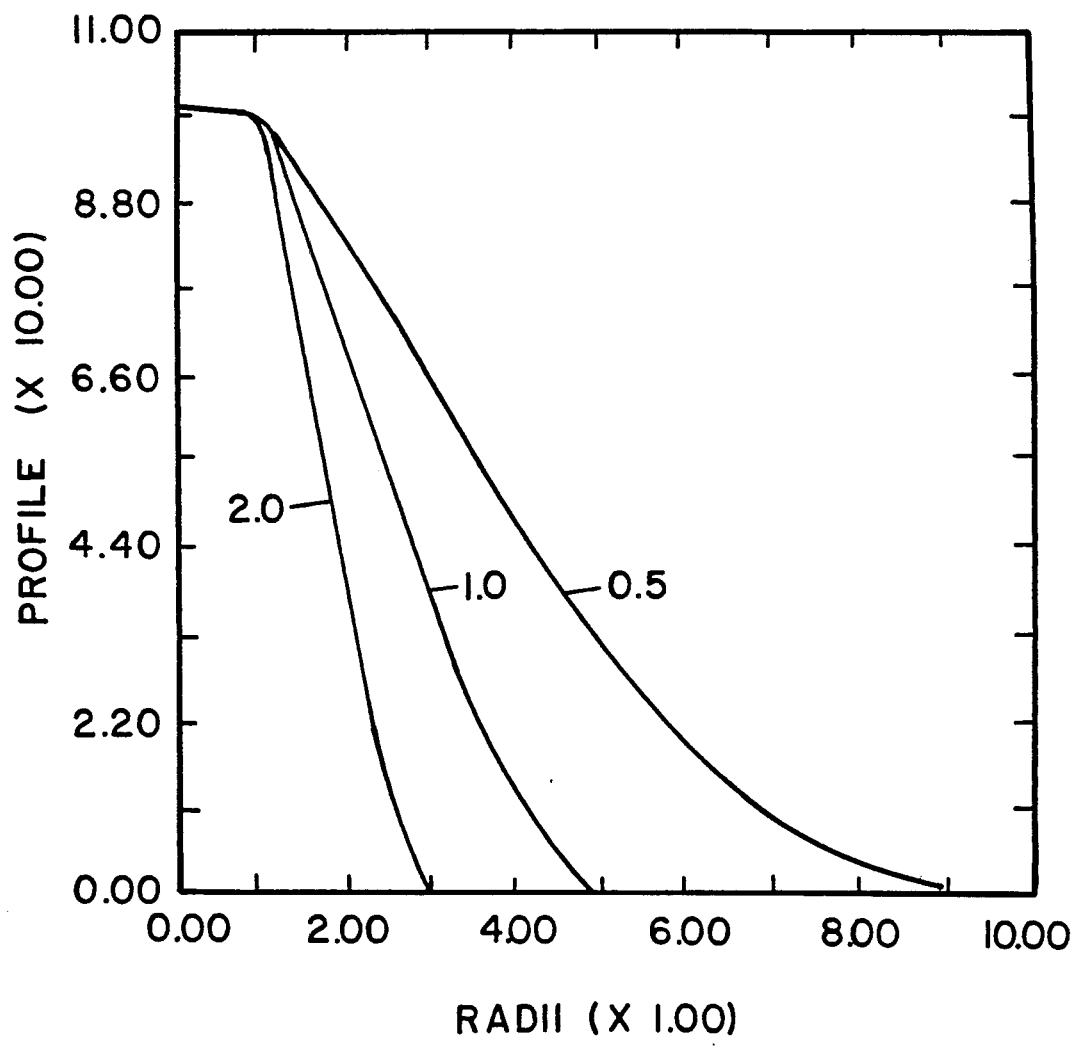
Figure 10:
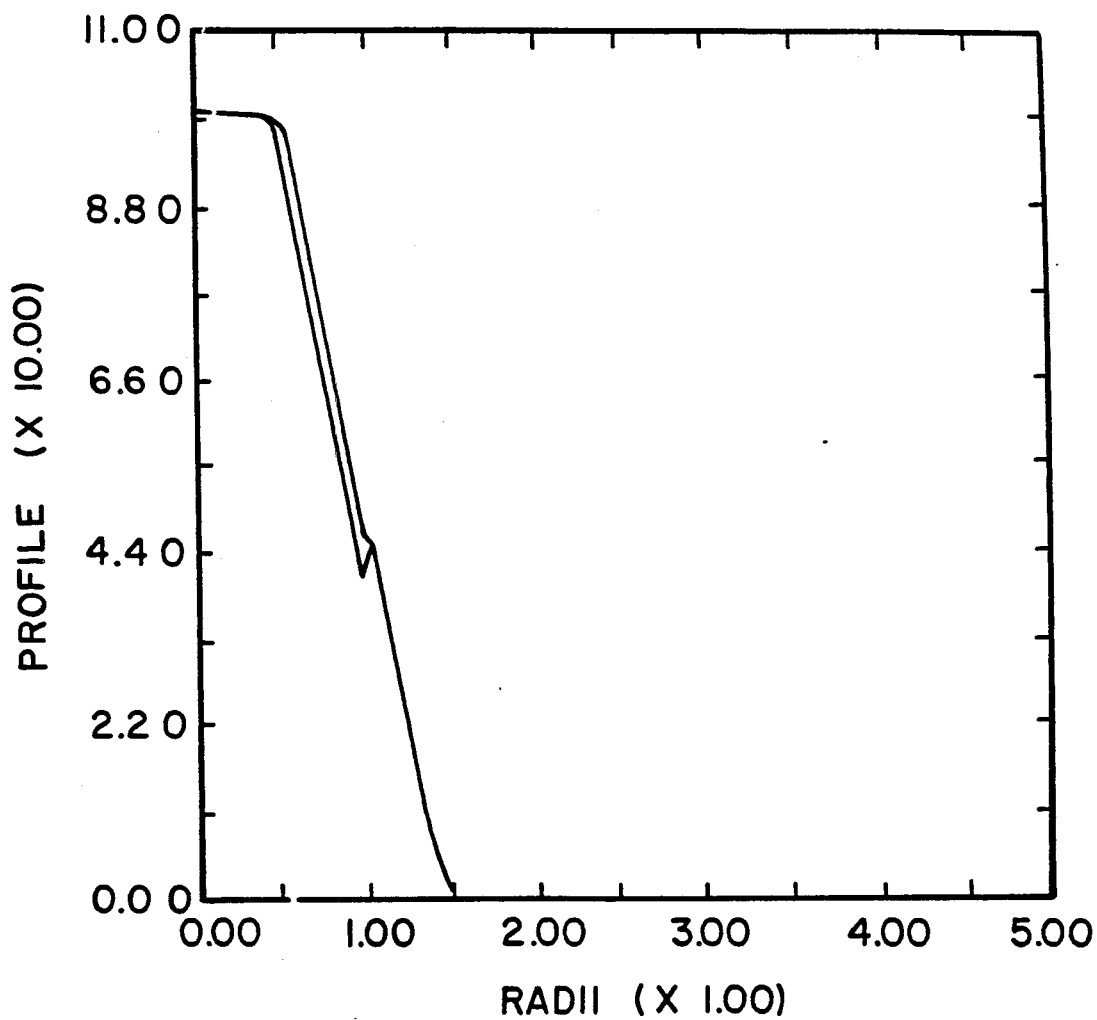

FIGS. 9 and 10 are graphs showing calculated lens profiles.

Figure 11:
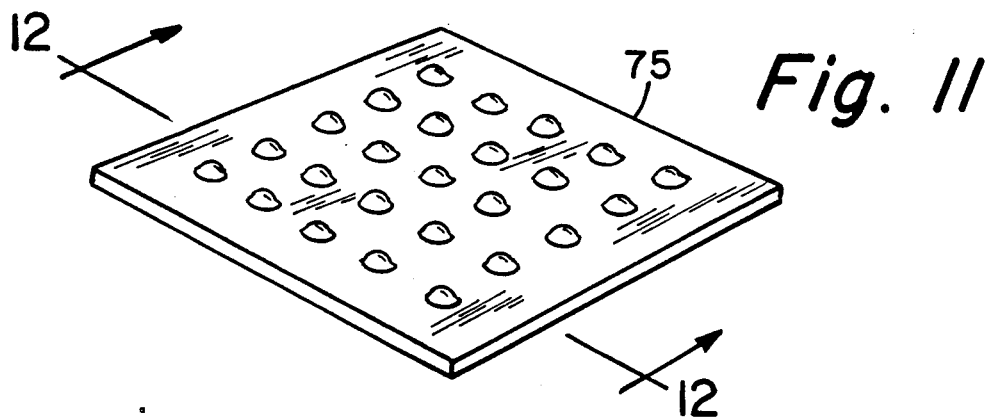

FIG. 11 is a top perspective view of a lens array of the present invention.

Figure 12:
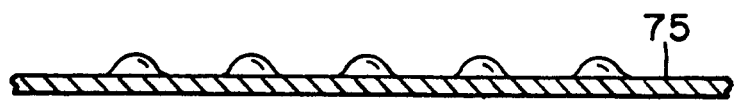

FIG. 12 is a cross-sectional view taken on line 12—12 of FIG. 11.

Figure 13:
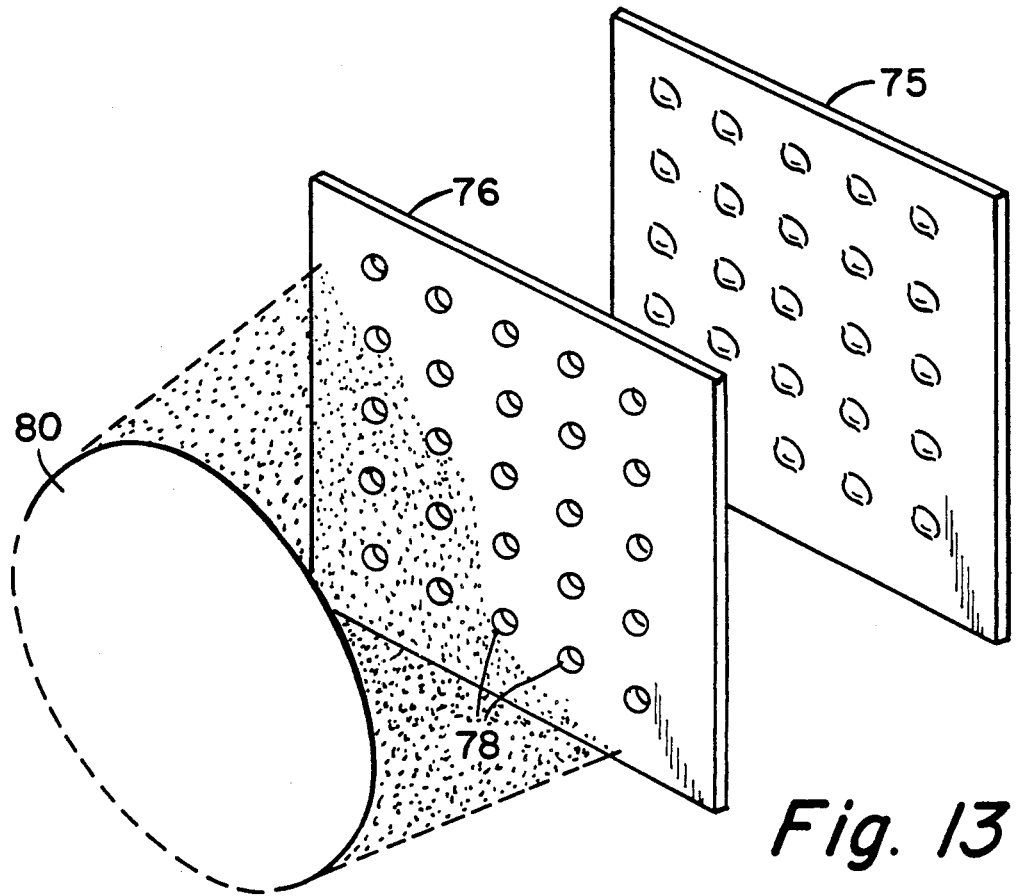
Figure 14:
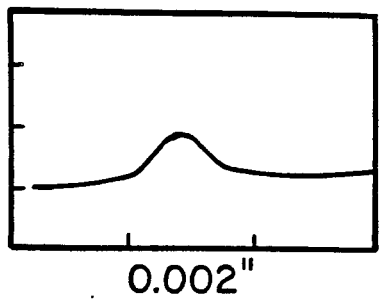
Figure 15:
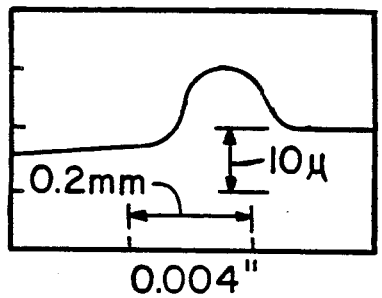
Figure 16:
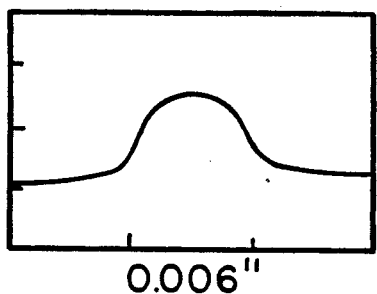
Figure 17:
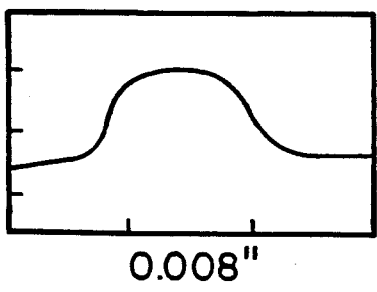

FIG. 13 is a side view of an apparatus of the present invention used to practice the method of the invention to make the array of the invention.

FIGS. 14 to 17 are graphs showing lens surface profiles resulting from stylus surface traces.

DETAILED DESCRIPTION OF THE INVENTION

As has been explained above, the present invention provides a method for forming single lenses or lens arrays. Those lens arrays typically comprise a raised pattern or texture on the surface of a transparent substrate. The lenses prepared in accordance with the inventive method follow generally the classical formula for focal length:

$$F = \frac{r_1 r_2}{(n-1)(r_1 + r_2)}$$

wherein F is the focal length of the lens, $r_1$ and $r_2$ are radii of curvature of the two lens surfaces, and n is the refractive index of the lens material. It is apparent from this formula that the focal length decreases as the refractive index increases. Consequently, where a lens demonstrating a short focal length is desired, lens material of high refractive index will be used. Short focal lengths are often desirable in imaging lens arrays because the distance between the lens array and the imaging surface or plane is customarily quite small. Thus, focal lengths between about 0.2-6 cm are often desirable.

The lenses prepared according to the inventive method commonly have at least one convex surface; the other surface may be flat or concave. The exterior configuration may be essentially any shape including round, elliptical, square, and rectangular. A plurality of such lenses may be fashioned to provide an array of lenses, usually on a single substrate, separated from each other by either constant space intervals or space intervals varying in a mathematically-defined manner.

Figure 1:
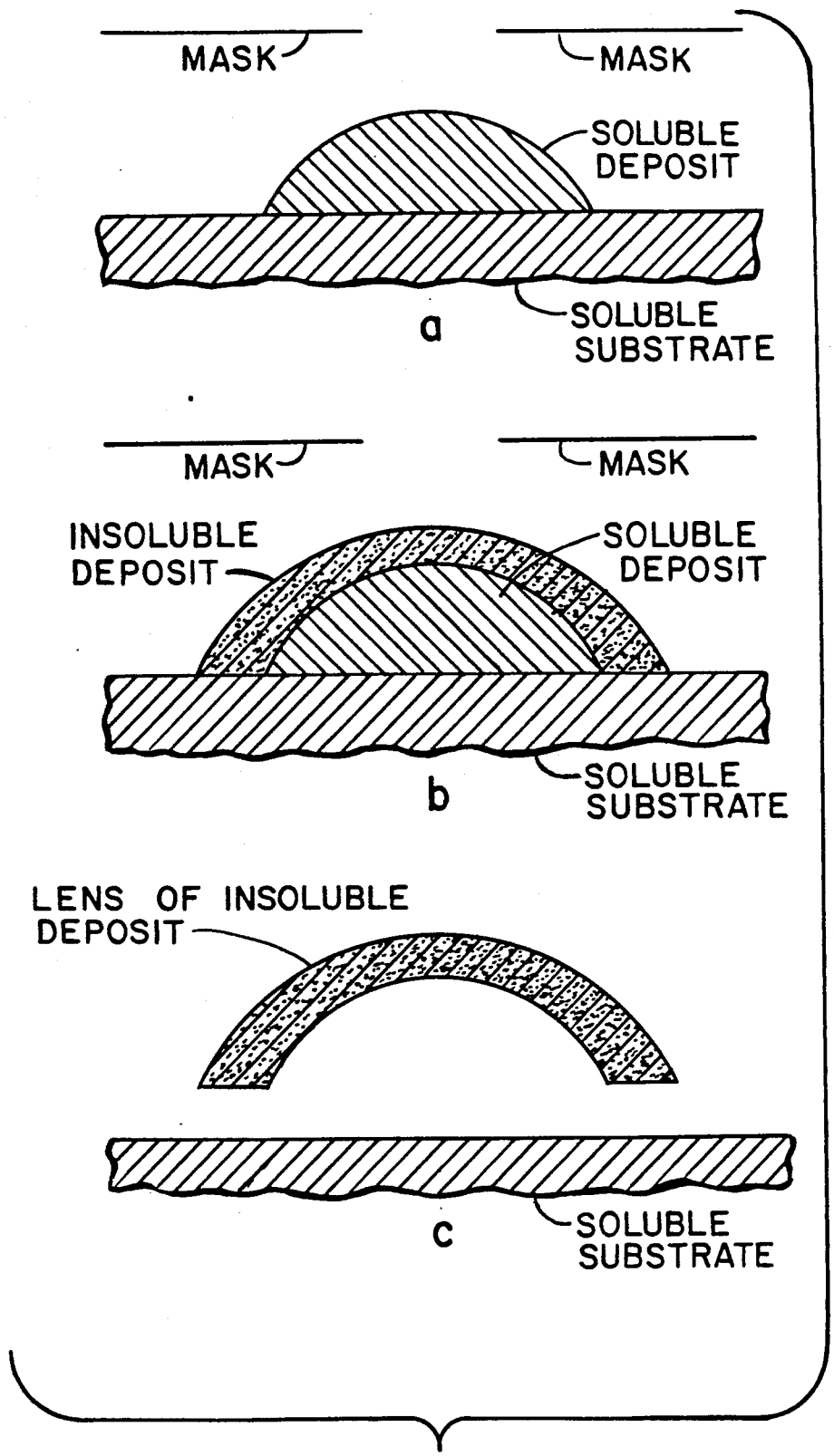
FIG. 1 is a cross-sectional view of convex-concave lenses being formed on a soluble substrate by the method of this invention.

The substrates upon which the lenses are deposited are normally flat, but it is quite possible to deposit lenses and lens arrays on substrates having other shapes, e.g., concave or convex surfaces. As observed above, the substrate may be composed of a material which is soluble in a liquid in which the lens substance is insoluble. That situation permits ready removal of the lens from the substrate. An example of that embodiment is an alumina lens deposited upon a sodium chloride substrate. Where a lens array is desired, at least that portion of the substrate under the deposited lens must be transparent; for example, an alumina lens deposited on a silicate glass substrate or an alumina lens on an alumina substrate. The substrates normally have a smooth surface but may have lens deposits thereupon which had been formed previously utilizing the inventive method. (See FIG. 1.) This method embodiment is primarily useful when soluble substrates are employed so that, on subsequent removal from the substrate, the lenses will exhibit a concave lower surface and, hence, are convex-concave. An example of that procedure comprises: first forming a sodium chloride lens on a sodium chloride substrate (FIG. 1a); thereafter depositing an alumina lens atop the sodium chloride lens (FIG. 1b); and then dissolving the sodium chloride substrate and lens in water (FIG. 1c). An alumina convex-concave lens remains.

The substance from which the present inventive lenses are prepared can be any material which is solid and transparent at the operating temperature to which the lenses will be exposed is use, but which can be transported as a vapor in line of sight in a vacuum. Furthermore, the material must solidify essentially instantaneously upon striking the substrate to avoid surface tension effects which can affect the lens figure.

"Operating temperature" is defined herein as the temperature at which the lens will be used. Customarily, the operating temperature is ambient temperature.

"Ambient temperature" is defined herein as between about 18°-30° C. Substantially higher and lower temperatures, however, can be used successfully. The temperature of use is limited only by the occurrence of fogging, deformation, or disintegration of the lens or substrate as, e.g., by cracking, crazing, or melting.

"Transparent" is defined herein as transparent to the types of electromagnetic radiation for which the lens is designed to function. Those radiations may have a broad range of wavelengths; viz., from X-ray, where a dense metallic lens may be used, to infrared rays, where crtain plastics or ceramics may be operable. Stated in another way, the lens may be transparent in any of one or more ranges in the X-ray, ultraviolet, visible, and infrared regions of the spectrum. Examples of suitable substances include amorphous materials, as well as certain microcrystalline materials which exhibit transparency because of the very small size of the crystallites.

Suitable microcrystalline inorganic materials include elements such as silicon, germanium, iron, and carbon; oxygen-containing compounds such as alumina, magnesia, titania, strontium titanate, barium titanate, strontium barium niobate, lithium niobate, ammonium dihydrogen phosphate (ADP), potassium dihydrogen phosphate (KDP), and deuterated potassium dihydrogen phosphate (KD*P); halides such as barium fluoride, calcium fluoride, cesium bromide, cesium iodide, cuprous chloride, lithium fluoride, magnesium fluoride, potassium bromide, potassium chloride, potassium iodide, silver bromide, silver chloride, sodium chloride, strontium fluoride, thallium bromide, thallium iodide, and thallium bromoiodide; sulfides, selenides, and tellurides such as arsenic trisulfide, arsenic triselenide, arsenic tritelluride, cadmium sulfide, cadmium selenide, cadmium telluride, lead sulfide, lead selenide, zinc sulfide, and zinc selenide; and arsenides such as gallium arsenide and indium arsenide.

Suitable inorganic materials which form glassy or amorphous deposits include silica, tantala, niobia, arsenic trisulfide, arsenic triselenide, arsenic tritelluride, selenium, silicate glasses, phosphate glasses, borate glasses, and germanate glasses. It is to be understood that glasses may include any suitable additives.

Suitable organic substances include amorphous or microcrystalline transparent polymeric substances such as certain polysaccharides, including complex sugars and regenerated cellulose, polyolefins such as high or low density polyethylene and polypropylene; polystyrene; polyvinylchloride; polyvinylidene chloride; polyvinyl alcohol, polyvinyl acetate, and acrylic polymers.

It is to be understood that the foregoing materials are only examples of suitable materials. Many other amorphous or microcrystalline substances may be used in accordance with the present invention.

The solid phase of the substance from which the lenses are prepared may be a microcrystalline material consisting of crystals too small to substantively interfere with the transparency to the selected radiation. Alumina is an example of such material. The solid phase may also be an amorphous solid having no well-defined crystalline structure such as silicate glass or low density polyethylene. Such amorphous substances are considered to be in solid phase for purposes of the present invention when no significant deformation occurs under operating conditions.

The source of vapor of the substance from which the lens is to be prepared may be a reservoir of the substance held at elevated temperature so that the vapor evaporates or sublimes from it. Such a reservoir may be produced, for example, by heating a container of the substance in an electric resistance heated furnace or by heating the substance directly by means of an electron beam gun. Another source of vapor can be a body of the substance from which the vapor is projected by DC or RF sputtering. The sputtering atmosphere can be either inert, e.g., argon, or reactive, e.g., oxygen. The gas pressure in the vacuum enclosure must be kept sufficiently low such that the vapor of the material to be deposited travels essentially in line of sight from the vapor source to the substrate. That mandate requires the mean free path over which vapor particles can travel before colliding with a gas atom must be much greater than the distance between the vapor source and the substrate. This mean free path is approximated by the formula:

Mean free path = 0.005/pressure wherein pressure is expressed in terms of torr and the mean free path is measured in centimeters. When the substance to be deposited is heated in an electric resistance heated furnace or heated directly by an electron beam, the pressure in the vacuum chamber is often about $10^{-6}$ torr, so the mean free path is very large. In contrast, when sputtering is employed to provide the vapor deposit, a typical pressure within the vacuum chamber is 0.001 torr, so the mean free path is only on the order of 5 cm. Accordingly, large separations between the vapor source and the substrate must be avoided when sputtering is employed.

As has been explained previously, the inventive method basically comprises projecting a vapor phase of an operable substance onto a substrate, the vapor solidifying substantially instantaneously upon the substrate to form the desired lens or lenses. The flux of the vapor impinging on the substrate is controlled in such a way that the depth of the deposit across the surface of the substrate is varied to produce a deposit (lens) having a convex surface geometry.

Figure 2:
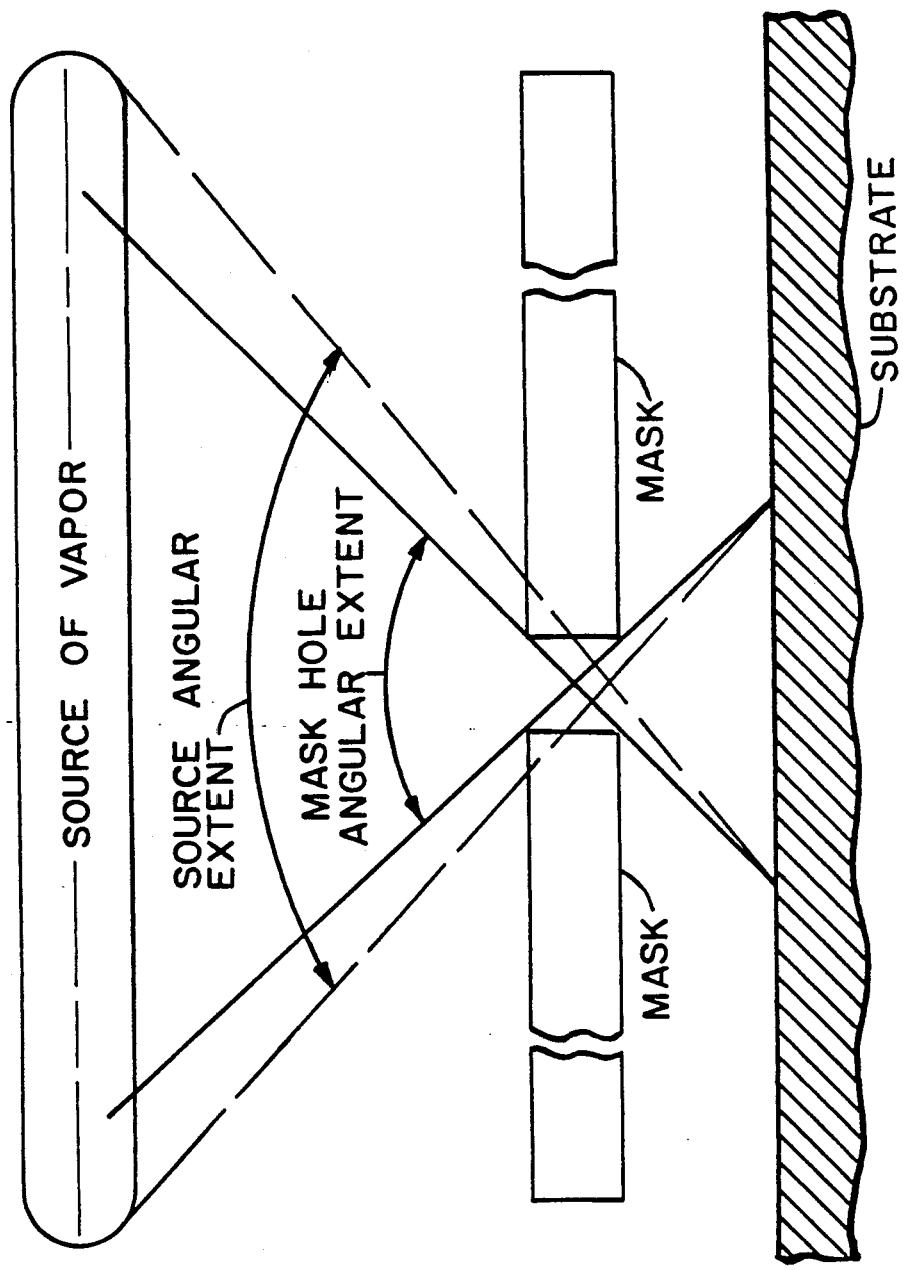

That capability of varying the thickness of the deposit is made possible by positioning at least one particularly-designed mask between the vapor source and the substrate. Hence, the mask has a hole therein of the approximate shape of the desired outer configuration of the lens through which the vapor passes to make contact with the substrate in line of sight from the source. The mask is spaced apart from the substrate by a small distance, typically about 1-3 mm or about 10-20 times the diameter of the hole in the mask. In contrast, the mask and substrate are separated from the vapor source by a much larger distance, customarily about 50-500 mm. The mask must be much closer to the substrate than to the source so that the dimensions of the deposit (lens) will be nearly identical to those of the hole in the mask. The thickness of the mask must be substantially less than the distance between the substrate and the bottom surface of the mask in order to avoid undesirable collimation of the vapor being emitted by the source. When viewed from the substrate through the hole in the mask, the vapor source, ideally, will have a solid angle extent which is greater than that of the hole in the mask. (See FIG. 2.) This construction mandates that the mask not have substantial open areas since such areas will require a vapor source of impractically large dimensions to be used and the mask-substrate and substrate-source distances increased to similarly impractical sizes. In addition, the dispersal of the vapor from the source must be diffuse, i.e., the source must emit vapor in all directions. These circumstances preclude the use of apertures to collimate the flux of the vapor. The spatial separation of the mask from the substrate in combination with the diffuse emission of vapor from the source allows vapor to impinge and deposit upon regions of the substrate which are outside the geometrical projection of the hole in the mask. (See FIG. 3.)

Some parts of the source, however, are obscured by the mask when viewed from regions of the substrate outside the geometrical projection of the mask hole; thus, the visible solid angle fraction of the source is smaller when observed from those regions. Furthermore, the portion of the source emitting to regions outside the geometrical projection of the mask hole lies at a greater angle to the normal to the source (FIG. 3a). Where an aperture is used, the flux of the source is blocked except for areas in direct line with the source. A uniform deposit results (FIG. 3b). Inasmuch as most vapor sources can be expected to be Lambertian, i.e., to emit vapor in amounts which depend upon the cosine of the angle between the normal to the source and the direction of emission, the vapor flux striking such regions is smaller than in those regions within the geometrical projection. The combination of those two effects results in a deposit which is deeper at one location than in another. The thickest portion is usually, but not necessarily, at the center of the deposit. The variations in depth of the deposit impart a convex surface thereto which, in turn, provides a lens effect to the deposit.

The solid portions of the mask which cause obscuration of the vapor source can be the walls of the hole in the mask, the surface of the mask facing the source of vapor, or a combination of the two. It is sometimes convenient to employ a series of two or more masks having holes therein which are in alignment, rather than a single mask of greater thickness. With this construction the surfaces of the masks facing the vapor source perform most of the obscuration. An advantage flowing from that construction is a reduction in the quantity of vapor which deposits within the hole of the mask. Such collections of vapor deposit reduce the size of and can even plug the hole, thereby preventing proper deposition on the substrate. When multiple masks are utilized, however, the total distance between the top of the mask closest to the vapor source and the bottom of the mask farthest from the vapor source must be substantially smaller than the distance between the substrate and the mask closest to the substrate in order to avoid undesirable collimation of vapor being emitted from the source.

Whereas the holes in the masks can be of any diameter, the angular extent of the vapor source renders the inventive method most valuable for the production of small lenses; hence, the need for masks with holes of small diameter. For example, when arrays of microlenses are to be formed, the holes in the mask will typically range between 0.05-0.3 mm in diameter. In the use of an array of holes, it is vital that the spacing between the holes is sufficiently great to prevent overlap between vapor deposits; i.e., no area on the substrate should receive a flux of vapor through more than one mask hole. Otherwise, the surface figure of the resulting lens will be disturbed.

As has been observed earlier, numerous sources for the generation of vapor particles are available and operable. The following description, which must be considered illustrative only, is directed to the use of an electron beam to strike and vaporize a target substance.

FIG. 4 shows an electron beam system 10 for vacuum evaporation of a substance 12. The system comprises a vacuum chamber 14 enclosed by sidewalls 16. An electron gun 18 is located within vacuum chamber 14 which provides a high energy electron beam 20 which is magnetically directed to the surface 22 of substance 12. The beam 20 may scan through area 24 shown. Substance 12 is contained within a crucible 26 which may be ceramic or steel. Steel can act as a magnet to accelerate the electrons in beam 20 toward surface 22. Upon striking surface 22, beam 20 causes a portion of substance 12 to become molten and vaporize forming vapor cloud 28 containing vapor molecules or particles directed away from surface 22 toward substrate 30. Intervening masks 32 and 34 having aligned holes 36 and 38 intercept a large quantity of vapor 28. Only the vapor which can pass through both of holes 36 and 38 in masks 32 and 34 can reach substrate 30. As can be seen in FIG. 4, portions of the masks surrounding the holes 36 and 38 cause an obscuring effect by intercepting less of the vapor which passes through the center of the holes than of that which passes near the edge of the holes. In particular, vapor from only area "a" of the substance can pass through holes 36 and 38 to the center of lens 40; whereas, vapor from only area "b" can pass through the holes 36 and 38 to a point near the right edge of lens 40. It is apparent that area "a" is much larger than area "b". The quantity of vapor deposited and solidified at the center of lens 40 will therefore be much greater than the quantity of vapor deposited and solidified near the edge of lens 40. As a result the lens 40 will have a curved surface.

For a further understanding of the effect of varying geometry on the shape of the resulting deposit, and to examine the range of shapes obtainable with fixed evaporation sources, reference may be had to FIG. 5. The evaporant source 42 is assumed to be circular and Lambertian with its diameter 44 and distance 46 from the substrate 47 taken as parameters. The diameter 48 of the circular holes 50 in mask 52, the mask thickness 54, and the mask-substrate distance 56 are also taken as parameters. The flux of material 58 reaching a given point 59 on lens deposit 60 is proportional to the solid angle subtended by the portion 62 (FIG. 6) of the source 42 which is visible from that point 59 through the bottom 64 of mask 52, multiplied by the cosine of the angle ω between the source normal and a line 65 connecting point 59 with source 42. Strictly speaking, to calculate the flux reaching a point one should take an integrated average over the visible portion of the source, since this angle will vary from source point to source point—however, this increased mathematical sophistication yields little extra insight. The flux of evaporant is greatest at the center of the lens. For off-axis points, three factors reduce the flux below that incident on the center of the lens: (1) the angular dependence of the flux emitted by the source and intercepted by the substrate; (2) the increasing distance between source and point on the substrate; and (3) the "convolution" of the upper 66 and lower 68 holes of the mask 52 (or of the source 52 and the hole 50) which reduces the solid angle through which flux is able to reach off-axis points (see FIG. 4). This convolution causes vapor to be intercepted by sidewall 70 in a thick mask or by the tops of the masks (the surfaces facing the source) when multiple aligned masks are used. The convolution is the most important in determining lens shape, since, typically, source-substrate distances are large so that little variation in angle to, or distance from, the source 42 is found across the diameter 72 of a lens.

The thickness of the vapor deposit at any point will normally be proportional to the flux of the vapor reaching that point. The measure of flux is determined by the product of the solid angle fraction of vapor source 42 visible through holes 66 and 68 from that point times the cosine of the angle ω between the source normal and the line connecting the visible portion of the vapor source and the point of deposit contact on the substrate (FIG. 5). Consequently, the configuration of the deposit can be predicted from a knowledge of variations in those areas visible from different points on the substrate.

An example of how to calculate the solid angle fraction of vapor source visible from point 59 on substrate 47 or lens deposit 60 through mask holes 66 and 68 is provided below. It will be understood that similar such calculations can be made for a variety of mask aperture configurations, and that variations in mask aperture configurations will result in different lens surface geometries. The particular surface figure desired will depend upon the application for which the lens is intended. Accordingly, the mask configuration required for forming a lens having a desired surface figure can be determined by calculating the lens deposit resulting from a particular mask configuration and thereafter varying the mask configuration until a lens figure approximating that desired is obtained. Such calculations are easily undertaken on a digital computer.

The solid angle fraction of vapor source visible from point 59 on substrate 47 or lens deposit 60 through mask holes 66 and 68 is determined primarily by the overlap of the holes in the masks. It will be recognized that the holes 66 and 68 can also represent the top and bottom of a hole in a single mask of some substantial thickness. In the present example the case of two aligned circular mask holes is considered.

When viewed from the center of the lens deposit, i.e., at the center of the geometrical projection of the center of the aligned mask holes, the alignment of the two apertures is complete and the open area through which the vapor flux can pass is at a maximum. However, the holes become more "convoluted", or less perfectly overlapped and aligned, when viewed from points on the substrate away from the center of the geometrical projection. The open area is thereby reduced which, in turn, decreases the flux of vapor reaching points away from the center of the geometrical projection.

Calculation of that apparent open area in the case considered here of two circular mask holes requires computation of the area of a circle lying above a chord 74 perpendicular to a radius R at a distance T out from the center as illustrated in FIG. 7.

The cross-hatched area, A, is a function of R and T:

$$A = A(R,T)$$

$$R^2 = x^2 + y^2$$

$$y = (R^2 - x^2)^{\frac{1}{2}}$$

$$d = (R^2 - T^2)^{\frac{1}{2}}$$

$$A(R,T) = 2 \int_0^d (y - T)dx$$

$$A(R,T) = 2 \int_0^{(R^2-T^2)^{\frac{1}{2}}} ((R^2 - x^2)^{\frac{1}{2}} - T)dx$$

$$A(R,T) = R^2 \sin^{-1}\left(\frac{R^2 - T^2}{R^2}\right)^{\frac{1}{2}} - T(R^2 - T^2)^{\frac{1}{2}}$$

Proper combination of two such terms then yields the necessary combined open area for overlapped circular holes as shown in FIG. 8 where the combined open area equals:

$$A(R_1,T_1) + A(R_2,T_2)$$

If it is assumed that the vapor source angular extent is much greater than that of the mask holes, then the solid angle of source visible from a point on the substrate is represented approximately by:

$$\text{solid angle} = \frac{[A(R_1, T_1) + A(R_2, T_2)]\cos\theta}{D^2}$$

where D is the distance between the substrate point and the mask hole point (FIG. 5). The flux of vapor reaching the substrate point is then given by:

flux = (solid angle) Cosω

It will be appreciated that the latter expression represents an approxmation only, since, more properly, an integral should be taken over the solid angle at each substrate point to correctly average the variations in D, $\theta$, and $\phi$ (FIG. 5), the last value being assumed constant, throughout the open area visible from any point on the substrate.

FIG. 9 illustrates typical lens profiles calculated in the manner outlined above. The lens thickness is scaled to unity at the center thereof, inasmuch as the absolute thickness of the lens depends upon the product of vapor flux and deposition time. The horizontal scale reflects units of mask hole radii. The vapor source diameter utilized in preparing FIG. 9 was 50 mm; the distance between the vapor source and the substrate was 10 mm; the distance between the substrate and the mask was 2 mm; and the diameter of the mask hole was 0.2 mm. It was assumed that the source normal and the substrate normal were parallel so that angle ω= angle θ. It is evident that the angular extent of the vapor source greatly exceeded that of the mask hole viewed from the substrate. The thicknesses of the masks (or, equivalently, the separation between upper and lower masks) were 0.5, 1.0, and 2.0 mm. Radial profiles from the center of the lenses outward are shown; the lenses were cylindrically symmetric. In the centers of the lenses, corresponding to the geometrical projection of the center of the mask holes, only slight rounding of the deposits resulting from variations in θ and D is observable. Away from the center, however, the overlap of the upper and lower mask holes reduces the solid angle of vapor source visible, and the flux of vapor is less.

When the thickness of the mask was 2 mm, i.e., equal to the mask-substrate distance, the resulting deposit was rather narrow and straight-sided and, therefore, of little utility as a lens. In contrast, when the thickness of the mask was reduced to 1.0 or 0.5 mm, broad, rounded, convex lens deposits were obtained.

FIG. 10 depicts the effect of using an aperture to produce a small distant vapor source with an angular extent which is small compared with the angular extent of the mask holes. The notch in the curve is an artifact of the calculation. The diameter of the vapor source was 5 mm; the distance between the substrate and the source was 100 mm; the distance between the substrate and the mask was 2 mm; and the diameter of the mask hole was 0.2 mm. The horizontal scale reflects units of mask hole radii, but the units are twice those used in FIG. 9. Masks having thicknesses of 0.5, 1.0, and 2.0 mm were employed. It was found that for all mask thicknesses the resulting deposit is narrow and essentially straight-sided; hence, not operable as a lens. That phenomenon illustrates that a system utilizing an aperture to reduce the vapor source angular extent is not suitable for practicing the instant invention. In contrast, as can be observed in FIG. 9, wherein aperturing was not utilized to reduce the vapor source angular extent, broad, rounded, lens deposits were obtained; the degree of rounding and the extent of the deposit can be controlled by variations in the placement of the masks and the configurations of the holes therein.

It will be recognized that, in principle, only the relative dimensions of a particular system matter. That is, if all the dimensions were increased by the same factor, an identical lens profile would result, but the lens would be larger. For example, if the parameters reported in FIG. 9 were stated in feet, instead of mm, thereby scaling up by a factor of 304.8, the same lens profile would result, but the diameter of the lens would be about 12 inches, rather than about one millimeter. As a practical matter, the utility of the instant invention is limited only by the requirement for very large, diffuse sources of vapor.

The method and apparatus of the invention may be used to prepare lens arrays 75, as demonstrated in FIGS. 11, 12, and 13. In producing such a lens array, a mask or masks 76 having a plurality of holes 78 can be used between vapor source 80 and lens array 75, as shown in FIG. 13.

As was noted above, the method and apparatus of the invention may also be utilized to produce convex-concave lenses or other small, similarly-shaped articles such as waveguide couplers and bearing cups. As viewed in FIG. 1, a lens or lens array prepared from a soluble material is formed on a soluble substrate. That lens or lens array performs as the substrate for deposition thereupon of a second lens or lens array prepared from an insoluble material. Upon dissolving away the soluble materials, a convex-concave lens or many convex-concave lenses results. It will be understood that the terms "soluble" and "insoluble" refer to ready solution in a common solvent, such as water. An example of a material soluble in water is sodium chloride; a material insoluble in water is alumina. The properties of the insoluble material chosen will, of course, depend upon the application to which the article is intended. In the case of bearing cups, for example, an amorphous material demonstrating high mechanical strength should be used.

As has been illustrated previously, the use of masks having circular apertures therein yields cylindrically symmetric vapor deposits and one type of surface profile. By exploiting the capability of generating masks having apertures of different shapes, the symmetry of the vapor deposits can be radically decreased. For example, a deposit exhibiting a four-fold rotational symmetry can be achieved utilizing a square mask. Furthermore, as can be appreciated, the resulting lens profiles will also be altered since, for example, in the above case of a mask containing a square hole, the vapor source solid angle visible from the substrate through two square holes decreases linearly for points away from the center of the geometrical projection. In contrast, in the analogous case of two circular holes, the vapor source solid angle visible from the substrate decreases more rapidly and with a more complex dependence. The use of combinations of masks containing holes of different shapes and sizes increases the degrees of freedom even further.

Finally, in the above discussion it has been assumed that the aperture in the mask and the substrate are centered directly beneath the vapor source. By moving the vapor source to one side, the resulting vapor deposits will be asymmetric, thereby making possible the formation of off-axis lenses.

Description of Specific Embodiments

EXAMPLE I

In a vacuum chamber, a deposit of alumina having a thickness of about two microns was laid down upon a glass substrate with an electron beam gun through a mask provided with an array of 0.2 mm diameter holes. The mask was spaced 2 mm from the substrate. The substrate was a standard glass microscope slide. The distance from the alumina source to the substrate was about 30 mm. The mask was made of lithium silicate glass in which holes had been chemically machined in accord with the teachings of U.S. Pat. No. 2,628,160 and had a thickness of 0.5 mm. The electron beam gun used was an Airco Temescal TM model 3C-FIH-100 with a 180° deflection electromagnet and single axis sweep. The gun was provided with an Airco Temescal TM model CV-10 constant voltage power supply adjustable from 4 to 10 kilovolts.

A controlled pressure of $10^{-4}$ torr oxygen was maintained in the vacuum chamber to prevent reduction of the alumina. The resulting alumina deposits were transparent and adherent. The deposits were rounded as evidenced by a Dektak TM stylus surface profiler which measures vertical stylus movements by use of a linear voltage displacement transducer (LVDT). The diameter of the deposits was about 0.4 mm and the peak height was about 1 micron. The deposits functioned as lenses having focal lengths of about 4 mm.

EXAMPLES II-V

Example I was essentially repeated except that glass comprised of about 50 percent silica, about 20 percent alumina and about 30 percent magnesia was used as the vapor substance rather than alumina. All percentages are by weight. No oxygen partial pressure was necessary, since the glass had no tendency to reduce spontaneously. Base pressure during evaporations was 0.4 microtorr and deposition rates of 35 angstroms per second were typical. The substrates used were standard glass microscope slides. Arrays of holes of about 0.05, 0.1, 0.15, and 0.2 mm diameter were present in the masks.

The resulting deposits were clear, colorless, and adherent. Scanning electron microscopic examination of the lenses showed that the surface quality of the lenses was excellent, and, except for some slight debris, the lenses were perfectly smooth down to the resolution limit of the microscope. Dektak TM traces of the lenses of the four different diameters showed that the lenses made using the masks having the 0.15 and 0.2 mm holes were somewhat flat-topped. The lens made with the 0.15 mm holes had a height of about 14 microns and a functional diameter of about 0.2 mm. The lens made with the 0.2 mm holes had a height of about 14 microns and a functional diameter of about 0.3 mm. The flat top of the large lenses is due to the fact that very little obscuring effect occurs near the center of the lenses when large mask holes are used in conjunction with relatively small mask-substrate distances. Such flattening is reduced when larger mask-substrate distances are used.

The lenses made using the smaller 0.05 and 0.1 mm diameter mask holes had tops which were more curved and functioned as imaging lenses. The height of the lenses made using 0.05 mm diameter mask holes was about 7 microns and the functional diameter was about 0.15 mm. The height of the lenses made using the 0.1 mm diameter mask holes was about 12 microns and the functional diameter was about 0.18 mm.

The focal length of the lens made using the 0.1 mm diameter mask hole was determined to be 0.48 mm using the image-distance-object-distance method.

The measured refractive index of the glass used in these examples was 1.584. Where the ratio of the lens thickness (h) at the lens center to the lens radius (Z) is small, the radius of curvature (r) of the lens may be calculated by the formula $$r = Z^2/2h.$$

The radius of curvature of the lens is therefore 0.338 mm. The lens has one planar surface. Therefore, when the refractive index, radius of curvature, and height of the lens are substituted into the equation $$f = r_1/(n-1)$$

a focal length of 0.58 mm is calculated which agrees reasonably well with the measured value.

The Dektak TM traces of these four lenses are shown in FIGS. 14 through 17.

We claim:

1. In a method for forming at least one deposit upon a substrate which comprises directing, in a vacuum, a vapor phase of a substance, which substance is solid and transparent at ambient temperature, from at least one means providing a source of said substance in vapor phase through at least one hole in a mask to strike and essentially instantaneously solidify upon a substrate, the improvement comprising, spacing said mask between said substrate and said means providing a source and providing the mask with sufficient thickness such that a converging cone of said substance in vapor form is passed into said hole and a diverging cone of said substance is directed from said hole to said substrate to thereby deposit a lens and solid portions of said mask surrounding said hole intercept the directed substance and cause said deposit to assume a smooth convex surface facing said source to thereby form a lens with a convex face.

2. A method according to claim 1 wherein said mask has a plurality of holes therein through which said vapor phase is directed to form a plurality of deposits of said substance on said substrate having convex surfaces facing said source to form a plurality of lenses.

3. A method according to claim 2 wherein the plurality of holes in said mask are in an array and the plurality of deposits comprise a lens array.

4. A method according to claim 1 wherein a plurality of masks having at least one hole which is in alignment with a hole in each of the plurality of masks are spaced between said substrate and said source, such that the solid portions of the surfaces of said masks facing said source intercept said source causing said deposit to assume a convex surface facing said source to form a lens.

5. A method according to claim 4 wherein the total distance between the surface of the mask facing the vapor source of the mask closest to the vapor source and the surface of the mask facing away from the vapor source of the mask farthest from the vapor source must be substantially smaller than the distance between the substrate and the mask closest to the substrate.

6. A method according to claim 1 wherein the size of said hole ranges between 0.05–0.3 mm in diameter.

7. A method according to claim 1 wherein said mask is spaced apart from said substrate at a distance about 10–20 times the diameter of the hole in said mask.

8. A method according to claim 1 wherein said mask and said substrate are spaced about 50–500 mm from said source.

* * * * *